(12) United States Patent
Sopori

(10) Patent No.: US 8,735,204 B1
(45) Date of Patent: May 27, 2014

(54) CONTACT FORMATION AND GETTERING OF PRECIPITATED IMPURITIES BY MULTIPLE FIRING DURING SEMICONDUCTOR DEVICE FABRICATION

(71) Applicant: Alliance for Sustainable Energy, LLC, Golden, CO (US)

(72) Inventor: Bhushan Sopori, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 13/744,152

(22) Filed: Jan. 17, 2013

(51) Int. Cl.
*H01L 31/18* (2006.01)
*H01L 31/0296* (2006.01)
*H01L 31/0224* (2006.01)

(52) U.S. Cl.
USPC .. 438/58; 438/98; 257/E31.015; 257/E31.126

(58) Field of Classification Search
None
See application file for complete search history.

(56) References Cited

U.S. PATENT DOCUMENTS

| | | | |
|---|---|---|---|
| 5,223,453 A | 6/1993 | Sopori | |
| 5,429,985 A | 7/1995 | Sopori | |
| 5,452,396 A | 9/1995 | Sopori | |
| 5,577,157 A | 11/1996 | Sopori | |
| 5,627,081 A | 5/1997 | Tsuo et al. | |
| 5,693,520 A | 12/1997 | Branner et al. | |
| 5,897,331 A | 4/1999 | Sopori | |
| 5,928,438 A | 7/1999 | Salami et al. | |
| 6,201,261 B1 | 3/2001 | Sopori | |
| 6,852,371 B2 | 2/2005 | Sopori | |
| 7,601,215 B1 | 10/2009 | Wang et al. | |
| 7,645,337 B2 | 1/2010 | Im et al. | |
| 7,670,885 B2 | 3/2010 | Mitsuhashi | |
| 7,811,900 B2 | 10/2010 | Henley | |
| 8,012,861 B2 | 9/2011 | Im | |
| 8,048,221 B2 | 11/2011 | Stoddard | |
| 8,110,480 B2 | 2/2012 | Henley | |
| 8,178,221 B2 | 5/2012 | Goyal | |
| 8,183,081 B2 | 5/2012 | Weidman et al. | |
| 8,241,941 B2 | 8/2012 | Dubois et al. | |
| 8,309,446 B2 | 11/2012 | Weidman et al. | |
| 2005/0239293 A1 | 10/2005 | Cui et al. | |
| 2005/0252544 A1 | 11/2005 | Rohatgi et al. | |
| 2006/0208257 A1 | 9/2006 | Branz et al. | |
| 2007/0169685 A1 | 7/2007 | Stoddard | |
| 2008/0241986 A1 | 10/2008 | Rohatgi et al. | |
| 2010/0159676 A1 | 6/2010 | Lieten | |
| 2010/0192838 A1 | 8/2010 | Stoddard | |
| 2010/0193016 A1 | 8/2010 | Fernandez et al. | |
| 2010/0193031 A1 | 8/2010 | Stoddard | |
| 2010/0193989 A1 | 8/2010 | Stoddard | |
| 2011/0003485 A1 | 1/2011 | Sopori | |
| 2011/0146782 A1* | 6/2011 | Gabor et al. | 136/256 |

(Continued)

OTHER PUBLICATIONS

Sopori, B. et al., "Using Silicon Injection Phenomenon During Fire-Through Contact Formation to Improve Process Control and Performance fo Screen-Printed Multicrystalline-Silicon Solar Cells," Proced. IEEE PVSC, Hawaii 2010.

*Primary Examiner* — Seahvosh Nikmanesh
(74) *Attorney, Agent, or Firm* — John C. Stolpa

(57) ABSTRACT

Methods for contact formation and gettering of precipitated impurities by multiple firing during semiconductor device fabrication are provided. In one embodiment, a method for fabricating an electrical semiconductor device comprises: a first step that includes gettering of impurities from a semiconductor wafer and forming a backsurface field; and a second step that includes forming a front contact for the semiconductor wafer, wherein the second step is performed after completion of the first step.

21 Claims, 11 Drawing Sheets

(56) References Cited

U.S. PATENT DOCUMENTS

| | | |
|---|---|---|
| 2011/0197960 A1 | 8/2011 | Pham et al. |
| 2011/0277682 A1 | 11/2011 | Rana et al. |
| 2012/0037066 A1 | 2/2012 | Stoddard |
| 2012/0042947 A1 | 2/2012 | Stoddard |
| 2012/0090537 A1 | 4/2012 | Stoddard |
| 2013/0087195 A1 | 4/2013 | Hovel |

* cited by examiner

CONTACT FORMATION AND GETTERING OF PRECIPITATED IMPURITIES BY MULTIPLE FIRING DURING SEMICONDUCTOR DEVICE FABRICATION

GOVERNMENT LICENSE RIGHTS

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Photovoltaic solar cell fabrication often involves the process of "co-firing" where metallic electrical conductors are mechanically and electrically coupled to semiconductor materials to create an electrical p-n semiconductor photovoltaic device. For example, during fabrication, an aluminum (Al) "ink" would be applied to a back surface (e.g., a p-type region) of a wafer of semiconductor material (such as a Silicon (Si) wafer). The opposing front surface (e.g. an n-type region layer) of the wafer would have a coating of silicon nitride (SiN) applied and a pattern of silver (Ag) "ink" applied over the SiN. The device is then fired (that is, heated in a furnace) such that the Ag ink dissolves through portions of the SiN layer to make electrical contact with the n-type region and the Al and Si at the back surface dissolve and then re-grow to form a good electrical and mechanical connection.

One problem associated with the fabrication of a photovoltaic solar cell involves the purity level of a semiconductor (e.g. Si) material. The purity level is often a function of the production facility used. That is, production of semiconductors wafers with little to no impurities usually requires tightly controlled clean-room environments. For industrial facilities attempting to produce Si wafers on a mass-production scale for photovoltaic solar cell devices, maintaining strict clean-room environments is economically prohibitive. Therefore, some degree of impurities can be expected to exist in the final fabricated wafers. Such industrial facilities may therefore employ one or more post-processing techniques to attempt to rid impurities from the wafers. For example, if Si layers of a photovoltaic device include dissolved (that is, non-precipitated) impurities within the silicon material, then optical processing can be used to cleanse the wafer. Under optical processing, a diffusion process (called gettering) can be initiated that will cause the dissolved impurities to migrate into the Aluminum contact material. For example, by initiating diffusion, dissolved iron (Fe) impurities can rapidly (i.e., in the matter of a few minutes) be removed from the Si layers. This serves to clean impurities from the silicon wafer. A problem occurs however, when the impurities include precipitated material. In that case, diffusion will not cause movement of the precipitated impurities from the silicon layers. Further, the durations and high temperatures required to dissolve the precipitate impurities may not be compatible with other co-firing process steps, and have the potential to increase manufacturing expenses.

BRIEF DESCRIPTION OF THE DRAWINGS

Embodiments described herein can be more easily understood and further advantages and uses thereof more readily apparent, when considered in view of this description and the following figures in which.

In accordance with common practice, the various described features are not drawn to scale but are drawn to emphasize relevant features. Reference characters denote like elements throughout Figures and text.

DETAILED DESCRIPTION

Embodiments of the present disclosure provide for semiconductor device fabrication techniques using multiple firing processes as discussed below. Typically, the temperatures needed to dissolve precipitated impurities are high, and need to be applied for extended durations. Further, because many common precipitated impurities (such as iron silicide) expand in volume as they dissolve, the precipitated impurity needs to be allowed to expand to occupy a greater volume. However, when a precipitated impurity is locked within the structure of a crystal lattice, (as would be the case for a precipitated impurity within a Si wafer), the crystal lattice structure prohibits such expansion unless the temperature of the lattice is quite high. While heating of the crystal lattice will cause the atoms of the lattice to vibrate, creating some room for expansion of the precipitated impurity, the durations and high temperatures required to dissolve the precipitate impurities may not be compatible with other co-firing process steps, and have the potential to increase manufacturing expenses. Embodiments described in the present disclosure address this objective technical problem by introducing multi-firing semiconductor device fabrication techniques as an alternative to traditional co-firing. These embodiments are described in greater detail with reference to the accompanying Figures.

One embodiment of the present disclosure comprises a first "back firing" process followed by a subsequent "front firing" process. Back-firing combines optimization of back contact properties with impurity gettering. One important property of a back contact layer is to create a field that can reflect minority carriers. As will be further discussed below, the inventors have found that formation of this field is strongly compatible with vacancy injection gettering—a process for injecting vacancies within the silicon wafer to act as getters. In vacancy injection, Si atoms within the crystal lattice are randomly replaced with vacancies. These vacancies, when situated in the proximity of a precipitate impurity, provide room for expansion which permits the precipitated impurity to dissolve at lower temperatures than possible without the vacancies. Once the impurity is converted into a dissolved state, diffusion takes over to remove the impurity from the silicon wafer. Vacancy injection is discussed further in U.S. Pat. No. 6,852,371 (entitled "Metal Processing for Impurity Gettering in Silicon" and issued Feb. 8, 2005) which is incorporated herein by reference in its entirety.

Figure 1A:
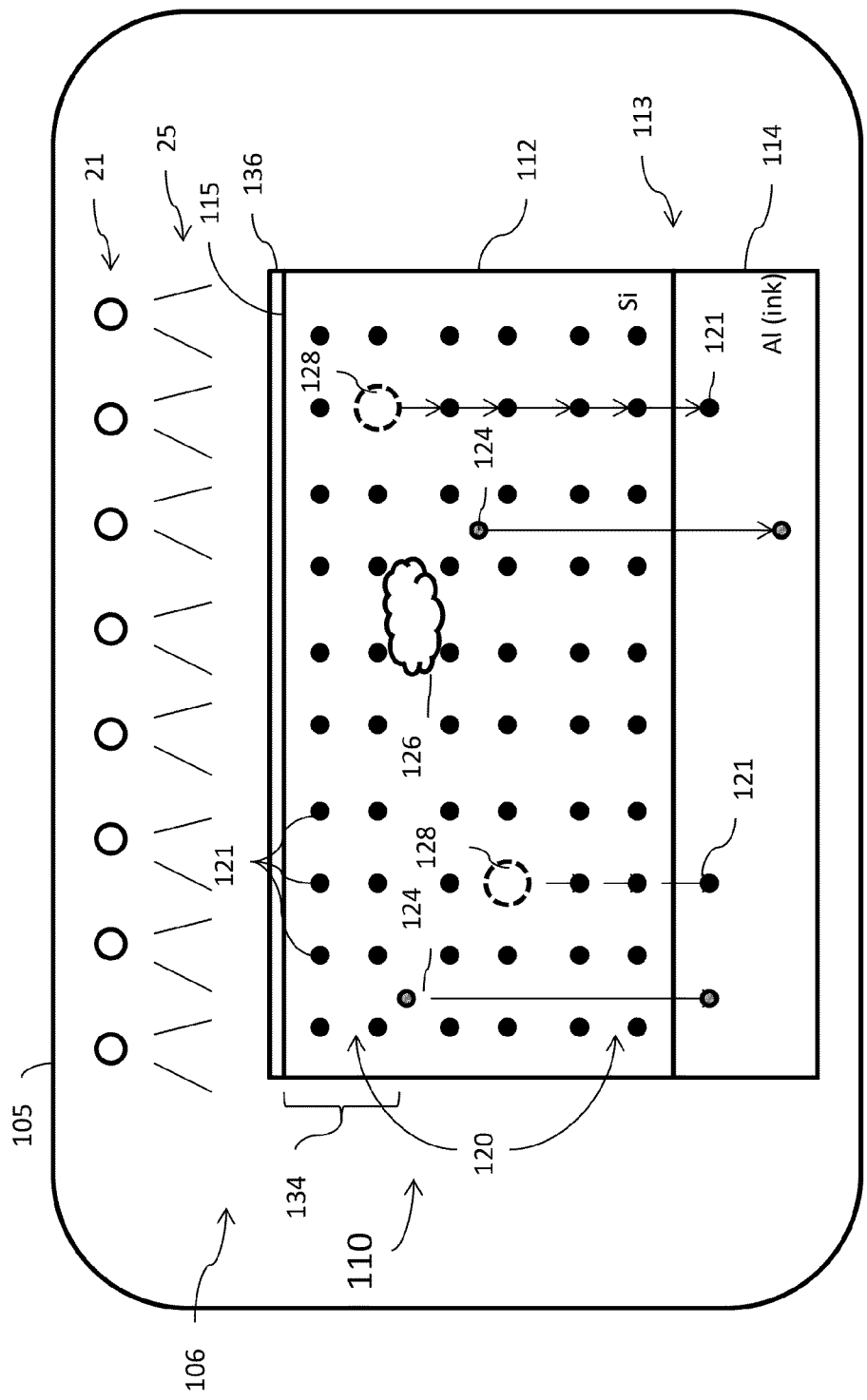
FIGS. 1A-1E are diagrams illustrating vacancy injected gettering for a semiconductor wafer for one embodiment of the present disclosure.

As illustrated in FIG. 1A, a semiconductor device 110 comprises a Silicon (Si) semiconductor wafer 112 having an Aluminum (Al) contact layer 114. In one embodiment, the Al contact layer 114 comprises one or more layers of an Al ink material applied to a back surface of the Si wafer 112 to form an interface 113 between the Si layer 112 and Al contact layer 114. The Si wafer 112 comprises a crystalline lattice 120 of Si atoms 121. Si layer 112 may also include one or more dissolved impurities (shown as 124) as well as one or more predicated impurities (shown as 126).

Prior to back-firing, one or more preliminary fabrication step are typically performed on wafer 112. For example, N-Type diffusion (such as a phosphorus diffusion, for example) may be employed to apply a thin layer of dopant source material (such as $P_2O_5$, for example) onto a front surface 115 of Si layer 112, which provides elemental material for diffusion into Si layer 112. This results in an N+ region (shown at 134) of Si material. For some embodiments, after a desired amount of dopant is deposited on the front surface 115 of silicon layer 112, the dopant source is removed, and the dopant is diffused deeper into the silicon layer 112 (for example, by using a during a high-temperature limited-source diffusion (or "drive-in") step). An anti-reflective layer 136, (such as one comprising Silicon Nitrite SiN:H for example) may also be applied over the front surface 115. In alternate embodiments, the N+ diffusion process drive-in step can also be done concurrently with the application of the anti-reflexive layer 136 and/or prior to, after, or during back-firing.

To purge dissolved impurities 124 from Si layer 112, semiconductor device 110 is optically processed within a chamber 106 of an optical furnace 105. Further details regarding different example embodiments of such an optical furnace may be found in any of U.S. Pat. No. 5,577,157 (entitled "Optical Processing Furnace with Quartz Muffle and Diffuser Plate" issued Nov. 19, 1996), U.S. Pat. No. 6,852,371 (entitled "Metal Processing for Impurity Gettering in Silicon" issued Feb. 8, 2005), and U.S. Patent Publication 2011/003485 (entitled "Optical Cavity Furnace for Semiconductor Wafer Processing" published Jan. 6, 2011), which are each incorporated herein by reference in their entirety. In different implementations, optically processing may be performed one wafer at a time, or in discrete batches of multiple wafers depending on the holding capacity of the optical furnace being used, or in other configurations.

Light sources 21 within the furnace would be controlled to achieve an application of optical energy 25 having the desired intensity profile. In one embodiment, within optical cavity furnace 105, the light sources 21 are segmented into three regions 152, 154 and 156, such as shown in FIG. 1D. In FIG. 1D, region 152 is designated "Front/Back", region 154 is designated "Right/Left" and region 156 is designated "Center." One of ordinary skill in the art would recognize that other implementations may comprise alternate configurations and/or segmentations of light sources 21. In the implementation shown in FIG. 1D, each of the regions 152, 154 and 156 have an associated controller (shown as respective controllers 153, 155 and 157) which regulate and control the power delivered to the light sources 21 within the respective regions. The power delivered by the controllers 153, 155 and 157 to light sources 21 is coordinated to provide an optical flux within optical cavity furnace 105 that produces a uniform temperature over semiconductor device 110.

By applying the back-firing processing techniques described herein, injected vacancies (shown at 128 of FIG. 1A) are introduced into Si layer 112 at the interface 113 between the Si layer 112 and the Al layer 114. As the term is used herein, a vacancy 128 refers to a missing Si atom 121 within the structure of crystal lattice 120. A vacancy 128 "moves" through the crystal lattice 120 as Si atoms 121 shuffle positions within the lattice 120. The process is initiated when optical energy 25 is applied to the semiconductor device 110 causing some of the Si atoms 121, from random locations within the Si layer 112, to diffuse into the Al layer 114. The Si atoms 121 that migrate from the Si layer 112 into the Al contact layer 114 each leave behind a vacancy 128 within the lattice 120. Note that Al atoms do not migrate into the Si layer 112 from the Al layer 114 in a reciprocal manner. Thus the net result is an increase in the number of vacancies 128 within the Si layer 112's lattice 120.

Figure 1B:
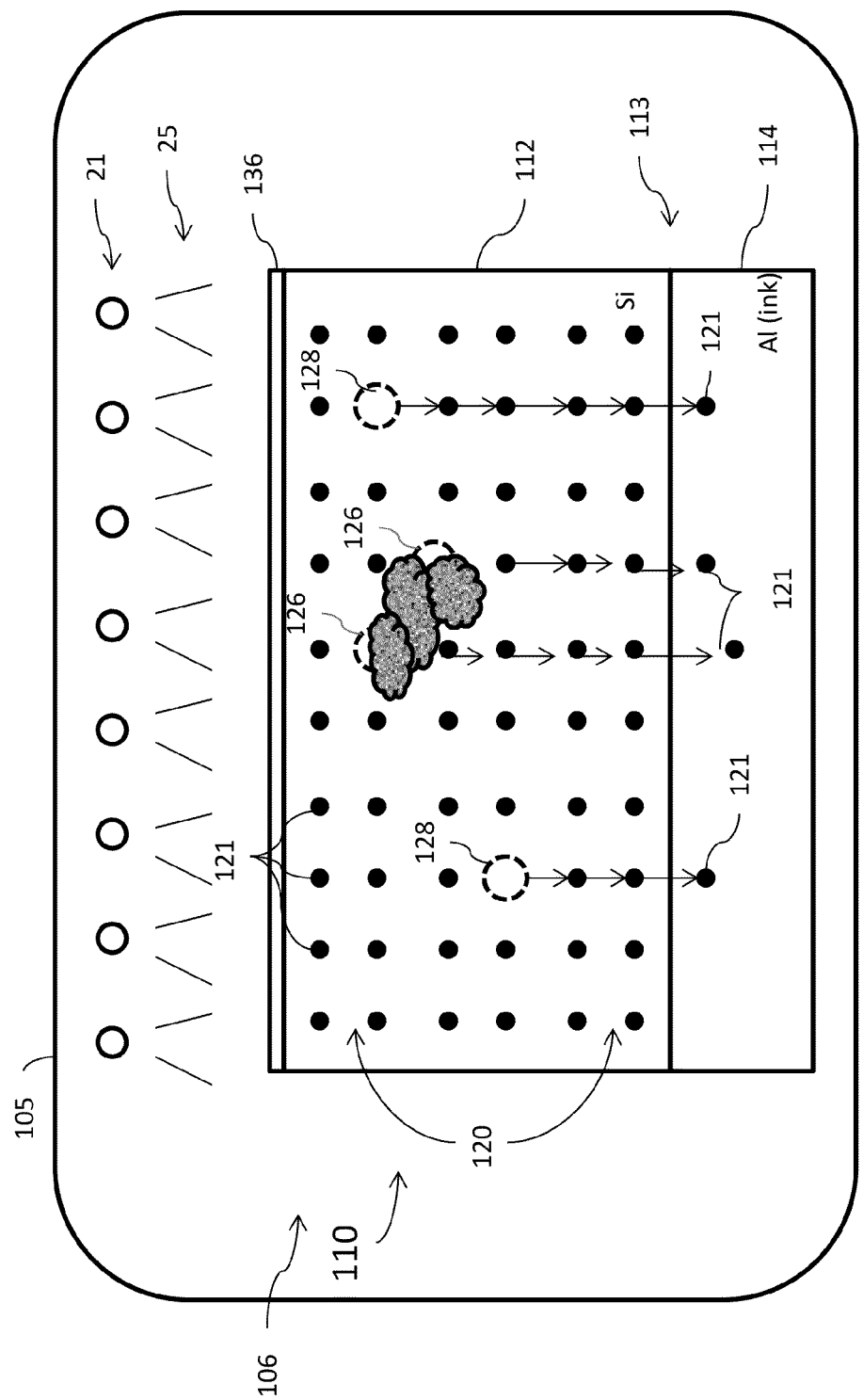
Figure 1C:
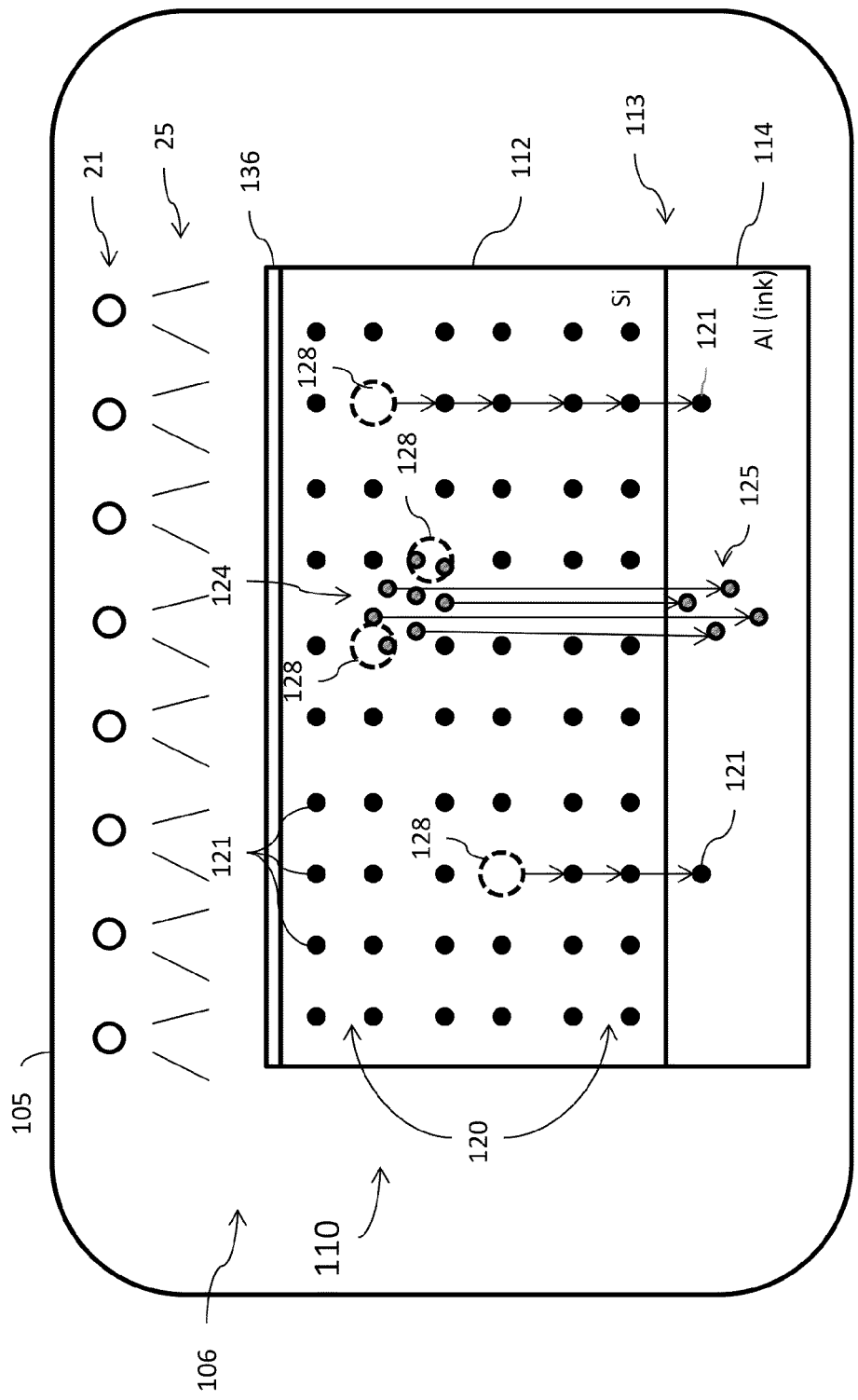
Figure 1D:
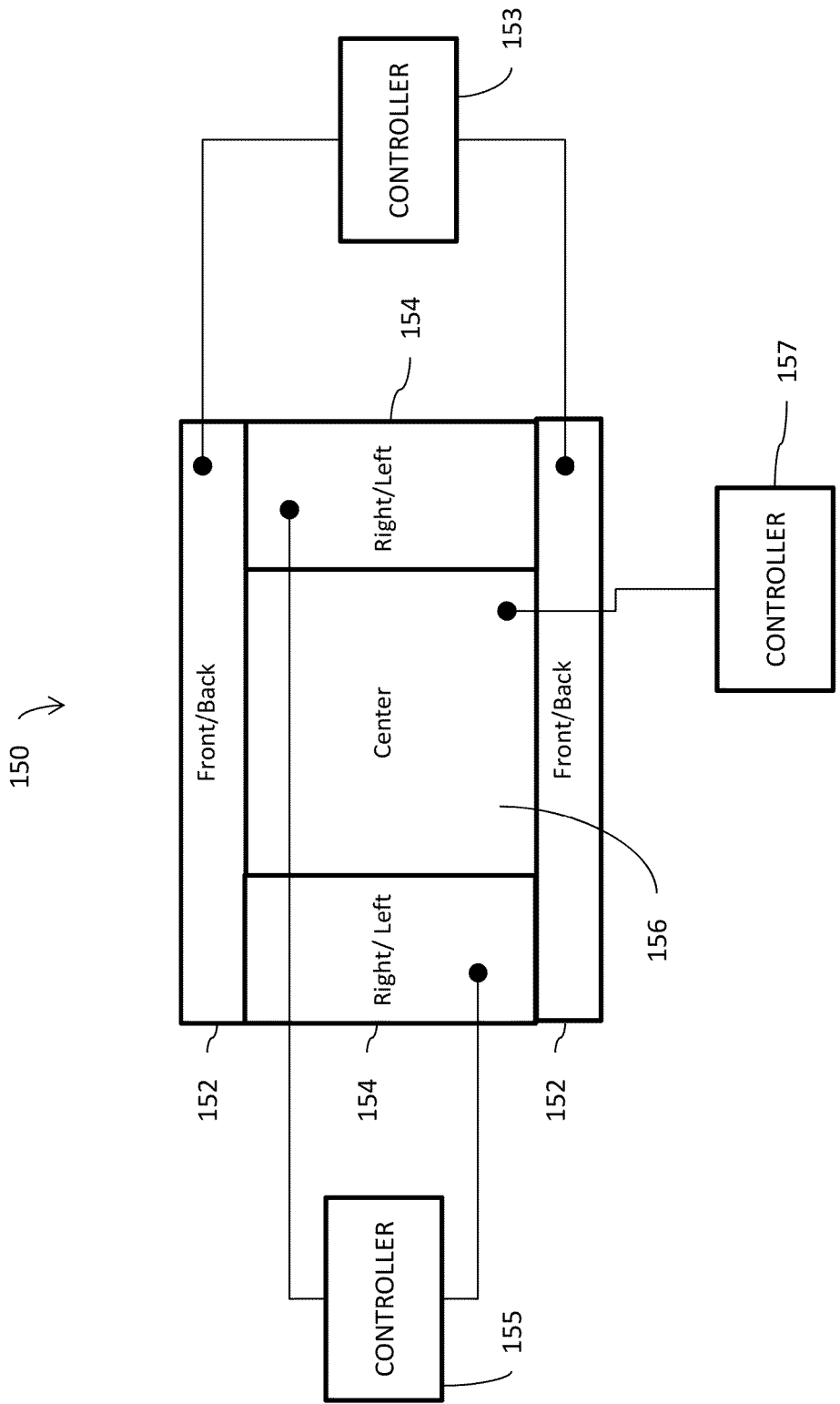

As illustrated in FIG. 1B, when vacancies 128 are formed proximate to a precipitated impurity 126, the precipitated impurities 126 may then expand within lattice 120. Provided this room to expand in the presence of optical energy 25, precipitated impurity 126 dissolves into a plurality of dissolved impurities 124 (as shown in FIG. 1C) and will migrate into Al layer 114, as shown generally at 125. That is, once in a dissolved form, the impurities 124 diffuse into and become trapped within the Al contact layer 114. Remaining unused vacancies 128, through the shuffling of Si atoms 121 within the crystal lattice 120, eventually dissipate.

It should be noted that during a first stage of the optical processing, optical energy 25 reaching the Si—Al layer interface 113 should be controlled to remain within a range that promotes diffusion across the interface 113 and avoids liquidation of Si. In other words, when the optical energy applied at the Si—Al interface 113 is too high, a liquid alloy of Si and Al will form at the interface 113 causing liquid Si to flow along the interface 113. If this condition occurs, the resulting liquid alloy will not allow any further diffusion of atoms from the Si layer 112 to cross into the Al contact layer 114. Thus alloying of the Si and Al should be avoided (at least for an initial duration of time) by regulating the optical energy 25 applied.

Figure 1E:
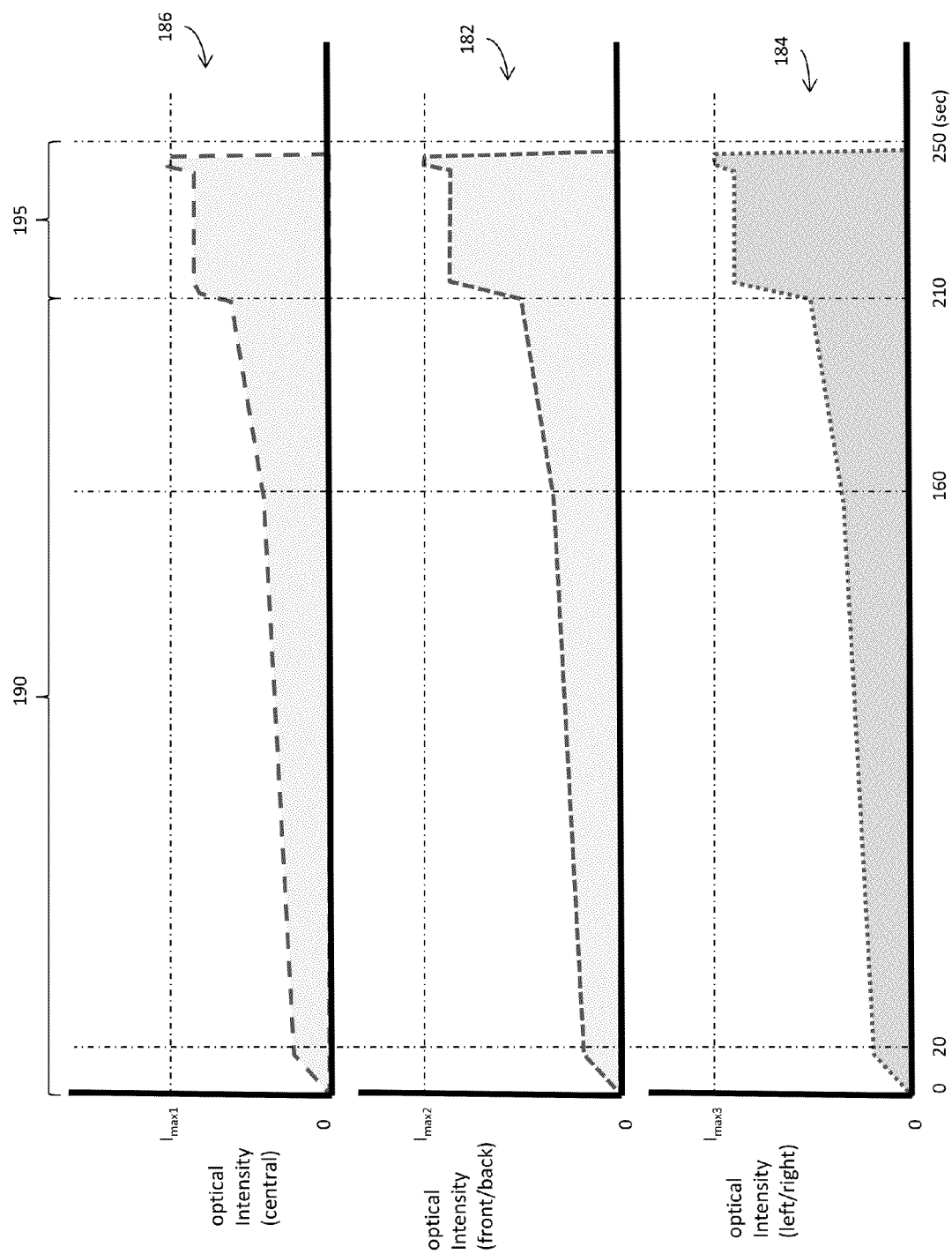

FIG. 1E illustrates one implementation of a set of time verses optical power profiles at 182, 184 and 186 provided by light sources 21 for a front-firing process. In this configuration, controller 153 controls power to light sources 21 in region 152 such that the optical energy 25 they output conforms to optical power profile 182. Controller 155 controls power to light sources 21 in region 154 such that the optical energy 25 they output conforms to optical power profile 184. Controller 157 controls power to light sources 21 in region 156 such that the optical energy 25 they output conforms to optical power profile 186.

The particular profiles 182, 184 and 186 are tailored so that light sources 21 provide an optical flux within optical cavity furnace 105 that produces a uniform temperature over semiconductor device 110. These particular profiles are about 250 seconds in total duration and have a "ramping stage" 190 shaped to gradually ramp up temperature, followed by a "high-intensity stage" 195 which increases optical flux via one or more step changes to the intended maximum intensity for each region (i.e., $I_{max1}$, $I_{max2}$, and $I_{max3}$). The ramping stage 190 provides a gradual warm up in order to minimize localized thermally induced stresses and maintain a temperature at the interface below that at which liquidation of the semiconductor material (e.g. Si) occurs. The "high-intensity stage" 195 completes backsurface field formation and also completes the process of fusing the Al material of Al contact layer 114 with the Si layer 112 to provide an electrode to the "back" P+ region of Si Layer 112.

Figure 2:
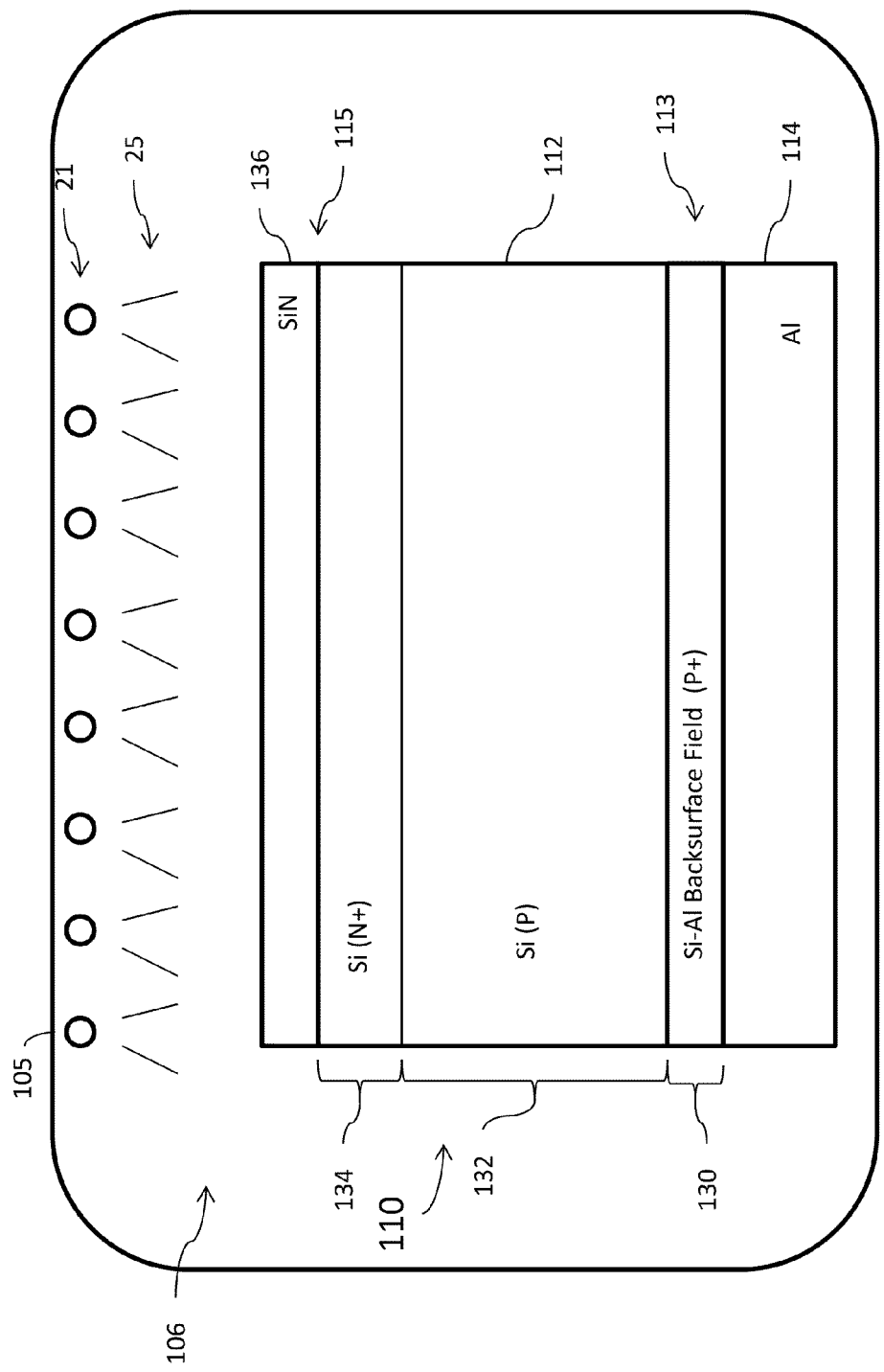
FIG. 2 is a diagram illustrating backsurface field formation for a semiconductor device of one embodiment of the present disclosure.

As explained with reference to FIG. 2, in addition to cleansing impurities 124 and 126 from Si layer 112, performing vacancy injection has the unforeseen advantage of enabling the growth of a larger and better defined backsurface field 130 than can be achieved through co-firing processes. While injected vacancies 128 are being formed in Si layer 112, and precipitated impurities 126 are being dissolved and then trapped within the Al layer 114 through diffusion, temperatures of the wafer 112 may be held at higher temperatures and for longer duration than possible during a co-firing process. This is possible because (unlike cofiring) there is no front metal present in this first firing step. In a cofiring process high temperature and long process times can cause the front metal to interact at the front surface and punch through the junction. However, in various embodiments described herein, such higher temperatures are very favorable for forming a high quality backsurface layer 130. Once a sufficient amount of time has elapsed to achieve the desired level of vacancy injected gettering, the high-intensity stage 195 applies a significantly higher intensity of optical energy to promote backsurface layer formation without adversely affecting the results of the vacancy injection.

An increased thickness of backsurface layer 130 contributes to an increased efficiency for solar cell applications because the backsurface layer 130 establishes a P+ region within the Si layer 112 which reflects elections (e) that attempt to cross interface 113. The heating generated during vacancy injection process helps produce a thin layer of Si—Al eutectic at interface 113 immediately before the melting of Al occurs. This thin layer of Si—Al eutectic promotes adhesion of liquid Al to the Si, thus allowing formation of a uniformly deep (i.e., thick) backsurface layer 130 at interface 113. The longer the vacancy injection process is permitted to continue, the thicker backsurface layer 130 will grow. There is a limit, however, on the thickness of the backsurface layer 130 that can be achieved because if the process is allowed to continue too long, Al material from layer 114 may begin to pass through Si layer 112 at some localized spots, where material can have defects such as multiple grain boundaries. If this occurs long enough to permit a sufficient amount of Al material to pass through Si layer 112, the ability for semiconductor device 110 to function as part of a solar cell is destroyed. Accordingly, both the intended maximum intensities ($I_{max1, 2, 3 ...}$) applied during the high-intensity stage 195 and the duration of high-intensity stage 195 should be limited. Optical energy applied during the high-intensity stage 195 can be increased in intensity to produce temperatures at interface 113 that exceed those that promote vacancy injection, but should be limited to avoid detrimental Al bleeding into Si layer 112. The impurity gettering and backsurface field processes described above comprise what is referred to herein as a "back-firing process" because they are each performed in conjunction with the process of fusing the Al material of Al contact layer 114 with the Si layer 112 to provide an electrode to the "back" P+ region of Si layer 112.

Figure 3:
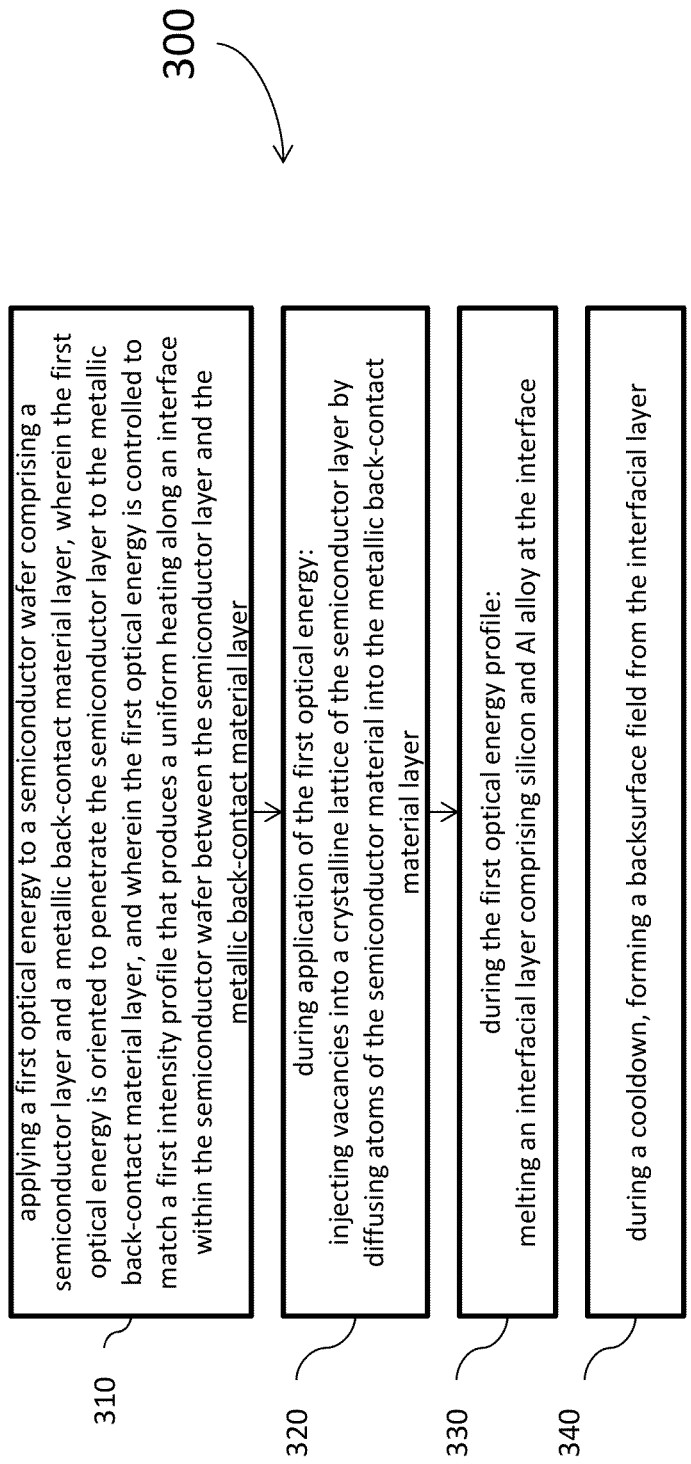
FIG. 3 is a flow chart illustrating a method for back-firing of one embodiment of the present disclosure.

FIG. 3 provides a flow chart illustration of one embodiment of a back-firing process shown as method 300. Method 300, for one or more embodiments, may be implemented in accordance with any combination of the steps or processes described above with respect to FIGS. 1A-1D and 2.

Method 300 begins at 310 with applying a first optical energy to a semiconductor wafer comprising a semiconductor layer and a metallic back-contact material layer, wherein the first optical energy is oriented to penetrate the semiconductor layer to the metallic back-contact material layer, and wherein the first optical energy is controlled to match a first intensity profile that produces a uniform heating along an interface within the semiconductor wafer between the semiconductor layer and the metallic back-contact material layer. The semiconductor may include a diffused N-P junction. In one embodiment, the semiconductor layer comprises a Silicon layer while the back-contact material layer comprises an Aluminum or Aluminum precursor (such as an Al ink) layer. In one embodiment, this is accomplished by optical processing of the semiconductor wafer in an optical furnace such as discussed above.

As mentioned above the optical energy applied should be controlled so that at the Si—Al layer interface liquidation of Si is avoided in the initial part of the flux-time profile. In other words, when the optical energy applied during optical energy profile 310 results in the temperature at the Si—Al interface being too high, a liquid alloy of Si and Al will form at the interface and causing liquid Si to flow along the interface. If this undesirable condition occurs, the resulting liquid alloy will not allow any diffusion of atoms from the Si layer to cross into the Al contact layer. Thus alloying of the Si and Al should be avoided by regulating the duration and shape of the first optical energy profile. Accordingly, applying the first optical energy profile may further comprise controlling the optical energy received at an interface between the semiconductor layer and the Al material to maintain a temperature at the interface below that at which liquidation of the semiconductor material (e.g., Si) occurs. For example, in one embodiment, optical power profiles provided by light sources 21 are controlled such as shown with respect to FIG. 1D. Profiles for different regions of light sources 21 are tailored so that light sources 21 provide an optical flux within optical cavity furnace 105 that produces a uniform temperature over semiconductor device 110. These particular profiles are about 225 seconds in total duration and shaped to gradually ramp up temperature and then increase optical flux in one or more step changes to the intended maximum intensity for each region (i.e., $I_{max1}$, $I_{max2}$, and $I_{max3}$). The ramping stage provides a gradual warm up of the furnace parts (if the furnace is started from cold) and prevents any thermal shock. Because the wafer 112 is heated isothermally, wafer breakage is not an issue. The temperature of the wafer during the ramp-up is maintained such that the temperature at the interface 113 is below that at which liquidation of the semiconductor material (e.g., Si) occurs. During this ramping stage, the method includes injecting vacancies into a crystalline lattice of the semiconductor layer by diffusing atoms (for example, Si atoms) of the semiconductor material into the metallic back-contact material layer (shown at 320). This process creates a composition at the interface that can generate a silicon-aluminum alloy of a low melting point.

The optical power is then increased rather rapidly to create a molten alloy at the interface. The composition of the alloy changes as the temperature is increased (becoming richer in silicon at higher temperatures). At the target maximum intensity, a thick layer of molten alloy at the interface, which is rich in silicon (indicated by block 330). During this period, the vacancies injection continues, while silicon interstitials are used up at the molten interface. The formation of the backsurface field occurs during the ramp-down part of the process cycle (shown at block 340). During the cooldown, the silicon with the highest dopant concentration solidifies first as an epitaxial layer. As the temperature of the wafer reduces, the doped silicon continues to grow forming a back surface field layer. Finally, the entire melt freezes as an alloy.

As mentioned above, back-fire processing may by proceeded by performing a dopant diffusion (such as the N-Type diffusion described above) onto a front surface of the semiconductor layer. In that case, the semiconductor layer is transformed by the method into a material having an N+ region at its front surface, a P+ region at its back surface and a P region between the N+ and P+ regions. The method may also include (or be proceeded or followed by) applying an anti-reflective material layer to the front surface region of the semiconductor layer (e.g., over the N+ silicon region formed).

Figure 4A:
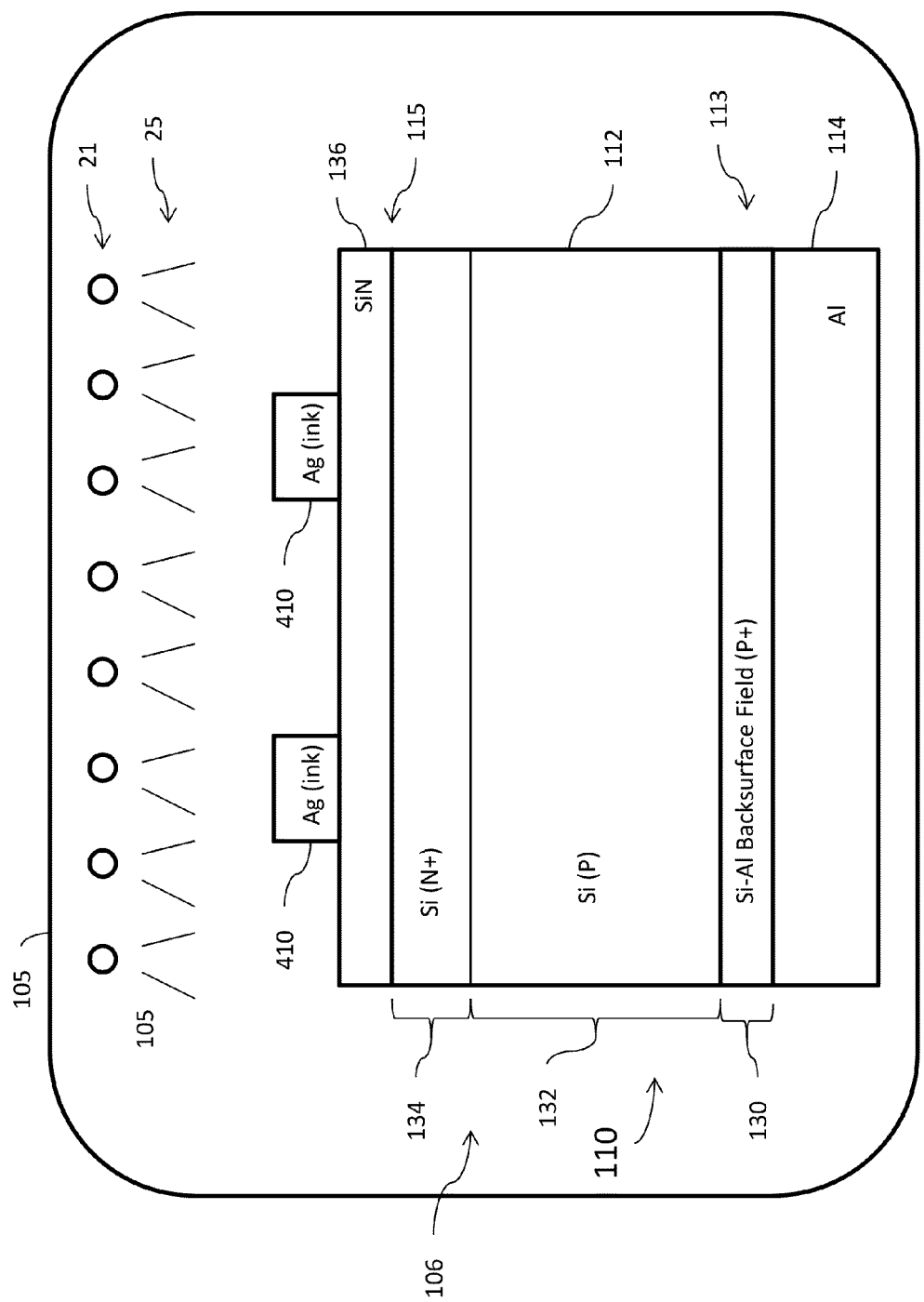
FIGS. 4A-4C are diagrams illustrating front-firing for a semiconductor device of one embodiment of the present disclosure.
Figure 4B:
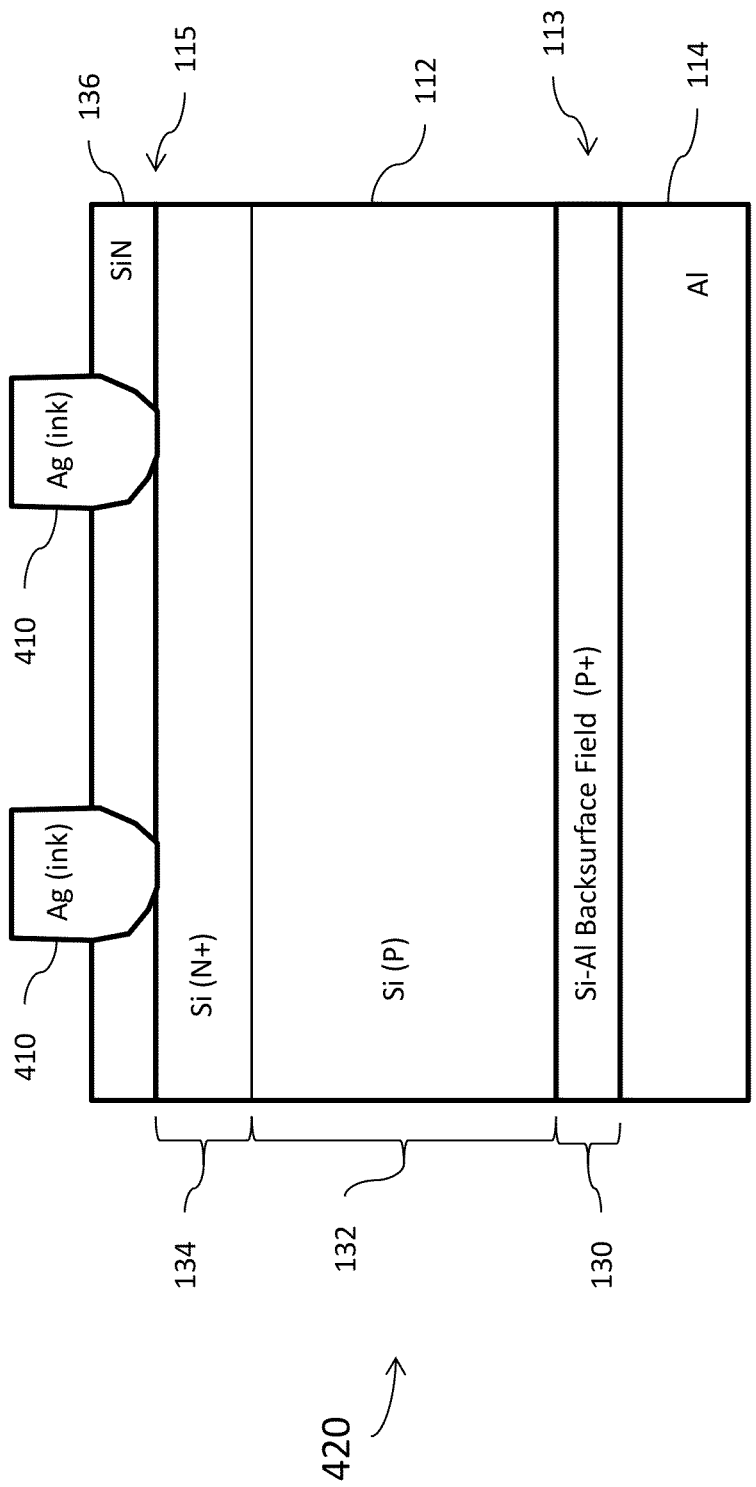

After the back-firing process described in FIG. 3, the front firing process is subsequently performed to provide electrodes on the front surface 115 Si Layer 112. This is illustrated by reference to FIGS. 4A-4B. Referring first to FIG. 4A, semiconductor device 110 is further configured with a patterned layer of front side metallic conducting material 410 (such as a Silver (Ag) ink, for example). This metallic conducting material would be applied, for example, over an SiN anti-reflective coating layer (such as anti-reflective coating layer 136). Again using optical processing such as described above, optical energy 25 from the bank of light sources 21 is applied to heat the front side metallic conducting material 410, causing the metallic conducting material 410 to etch through anti-reflective coating layer 136 and form a mechanical and electrical bond with the N+ region 134 of Si layer 112 (as shown in FIG. 4B). During front-firing, the optical energy is applied at lower intensity and for a shorter duration of time as compared to back-firing, such that it does not affect the results obtained from the prior back-firing. As would be appreciated by one of ordinary skill in the art upon reading this disclosure, for PV applications, the metallic conducting material 410 forming the electrical connection to N+ region 134 should be patterned accordingly to permit a sufficient number of photons to penetrate into Si layer 112. The resulting semiconductor device 420 shown in FIG. 4B thus provides an electrical device having a P-N junction suitable for photovoltaic (PV) applications.

Figure 4C:
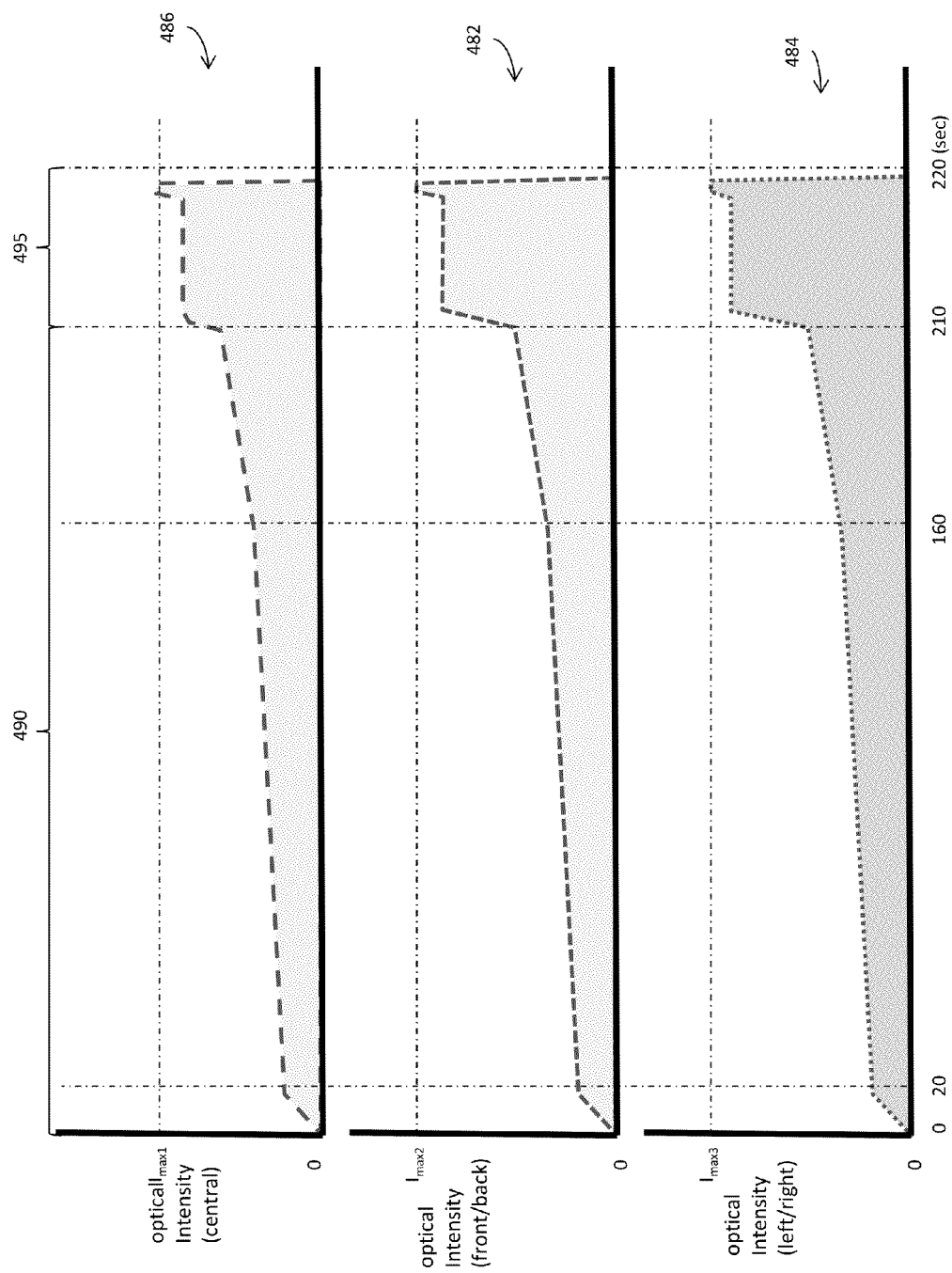

FIG. 4C illustrates one implementation of a set of time verses optical power profiles at 482, 484 and 486 provided by light sources 21 with respect to a front-firing process. As with the back-firing process, the particular profiles 482, 484 and 486 are tailored so that light sources 21 provide an optical flux within optical cavity furnace 105 that produces a uniform temperature over semiconductor device 110. The optical energy applied by profiles 482, 484 and 486 are tailored to result in lower temperatures within the semiconductor wafer than produced by profiles 182, 184 and 186. Also, optical energy applied by profiles 482, 484 and 486 have a much shorter duration in the region 495 (ie, beyond the 210 second mark) than profiles 182, 184 and 186. For example, the duration of the highest flux can be less than 10 seconds, compared to about 40 seconds during back-firing. As such, the results achieved during the back-firing process are not adversely affected by the front firing process. A ramping stage 490 provides a gradual warm up in order to minimize localized thermally induced stresses. The "high-intensity stage" 495 completes the firing of the metallic conducting material 410 to semiconductor layer 112. In one embodiment, the optical energy applied by profiles 482, 484 and 486 has a duration of about 1 second and produces a peak temperature in the range of 800 to 850 degrees at the front side 115 of Si layer 112.

Figure 5:
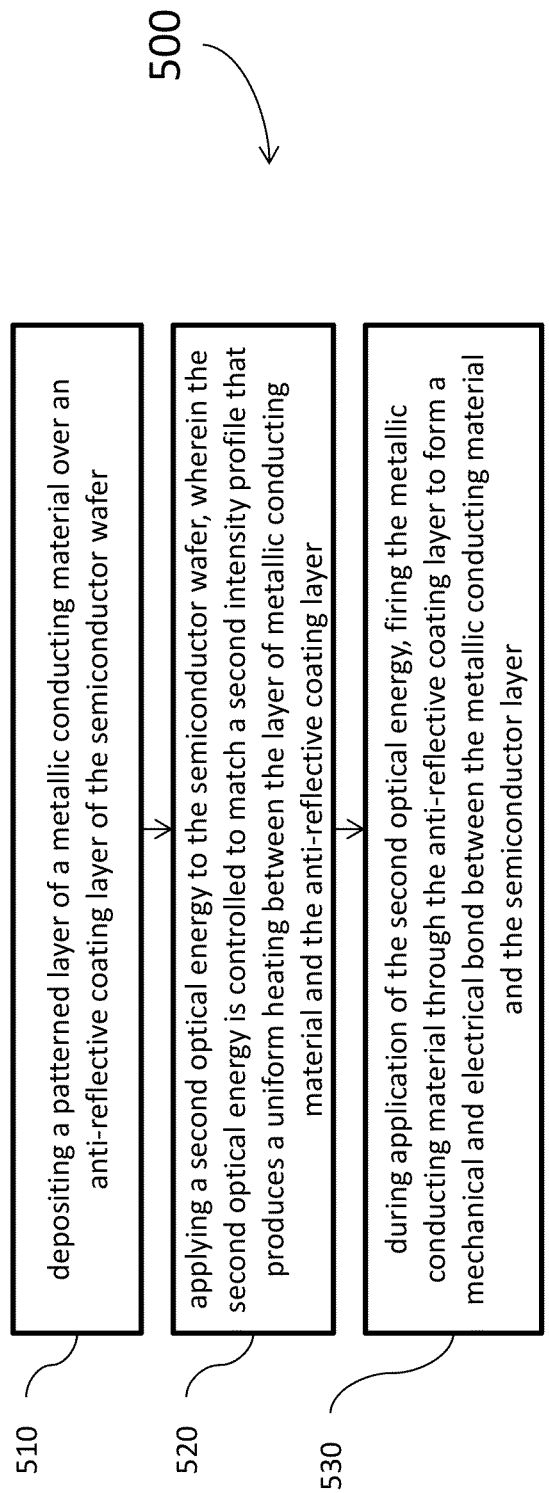
FIG. 5 is a flow chart illustrating a method for front-firing of one embodiment of the present disclosure.

These process steps described with respect to FIGS. 4A-4C comprise what is referred to herein as a "front-firing process" because they are each performed as part of the process of fusing electrical connections 410 to the front side 115 of Si layer 112. One embodiment of such a front-firing process is illustrated with respect to the method 500 illustrated in FIG. 5, which may be implemented in accordance with any combination of the steps or processes described above with respect to FIGS. 4A-4C and optionally in conjunction with an optical furnace such as disclosed in U.S. Pat. No. 5,577,157 incorporated herein by reference in its entirety.

Method 500 follows method 300 and begins at 510 with depositing a patterned layer of a metallic conducting material over an anti-reflective coating layer of the semiconductor wafer. In one embodiment, this comprises depositing a patterned layer of a Silver (Ag) ink, for example, over an SiN anti-reflective coating layer of the semiconductor wafer. The method then proceeds to 520 with applying a second optical energy to the semiconductor wafer, wherein the second optical energy is controlled to match a second intensity profile that produces a uniform heating between the layer of metallic conducting material and the anti-reflective coating layer. As mentioned above, the optical energy applied by the second optical energy profile during the front-firing process will produce lower temperatures within the semiconductor wafer and have a much shorter duration than the first optical energy profile so that the structures established by the back-firing process are not adversely affected by the front firing process. In other embodiments, other temperature profiles may be tailored based on the materials used for the metallic conducting material. The method then proceeds to 530 where during application of the second optical energy, the method comprises firing the metallic conducting material through the anti-reflective coating layer to form a mechanical and electrical bond between the metallic conducting material and the semiconductor layer.

Although specific embodiments have been illustrated and described herein, it will be appreciated by those of ordinary skill in the art than any arrangement, which is calculated to achieve the same purpose may be substituted for the specific embodiments shown. This application is intended to cover any adaptations or variations. Therefore, it is manifestly intended that this application be limited only by the claims and the equivalents thereof.

What is claimed is:

1. A method for fabricating an electrical semiconductor device, the method comprising:
   applying a first optical energy to a semiconductor wafer comprising a semiconductor layer and a metallic back-contact material layer, wherein the first optical energy is oriented to penetrate the semiconductor layer to the metallic back-contact material layer, and wherein the first optical energy is controlled to match a first intensity profile that produces a uniform heating along an interface within the semiconductor wafer between the semiconductor layer and the metallic back-contact material layer;
   during application of the first optical energy:
      injecting vacancies into a crystalline lattice of the semiconductor layer by diffusing atoms of the semiconductor material into the metallic back-contact material layer; and
      melting an interfacial layer comprising silicon and Al alloy at the interface;
   during a cooldown, forming a backsurface field from the interfacial layer;
   after the cooldown:
      depositing a patterned layer of a metallic conducting material over an anti-reflective coating layer of the semiconductor wafer;
      applying a second optical energy to the semiconductor wafer, wherein the second optical energy is controlled to match a second intensity profile that produces a uniform heating between the layer of metallic conducting material and the anti-reflective coating layer; and
      during application of the second optical energy, firing the metallic conducting material through the anti-reflective coating layer to form a mechanical and electrical bond between the metallic conducting material and the semiconductor layer.

2. The method of claim 1, wherein the semiconductor device comprises a Si wafer, and the metallic back-contact material layer comprises an Al ink material.

3. The method of claim 1, further comprising performing a dopant diffusion onto a front surface of the semiconductor layer.

4. The method of claim 3, wherein the dopant diffusion comprises an N-Type diffusion.

5. The method of claim 1, wherein applying the first optical energy and the second optical energy is performed within an optical cavity furnace.

6. The method of claim 1 further comprising:
applying the anti-reflective material layer to a front surface region of the semiconductor layer.

7. The method of claim 1 wherein the anti-reflective material layer comprises an SiN anti-reflective coating layer.

8. The method of claim 1, wherein the metallic conducting material comprises a Silver (Ag) ink material.

9. The method of claim 1, wherein firing the metallic conducting material through the anti-reflective coating layer forms a mechanical and electrical bond between the metallic conducting material and a doped region of the semiconductor layer.

10. The method of claim 1, wherein temperatures produced within the semiconductor wafer by the second optical energy are less than temperatures produced within the semiconductor wafer by the first optical energy.

11. A method for fabricating an electrical device having a P-N junction, the method comprising:
providing a semiconductor wafer comprising a semiconductor layer and a metallic back-contact material layer;
performing a back-firing process on the semiconductor wafer, the back-firing process comprising:
applying a first optical energy to a semiconductor wafer comprising a semiconductor layer and a metallic back-contact material layer, wherein the first optical energy is oriented to penetrate the semiconductor layer to the metallic back-contact material layer, and wherein the first optical energy is controlled to match a first intensity profile that produces a uniform heating along an interface within the semiconductor wafer between the semiconductor layer and the metallic back-contact material layer;
injecting vacancies into a crystalline lattice of the semiconductor layer by diffusing atoms of the semiconductor material into the metallic back-contact material layer; and
forming a backsurface field between the semiconductor layer and the metallic back-contact material layer;
after the back-firing process, performing a front-firing process on the semiconductor wafer, the front-firing process comprising:
applying a second optical energy to the semiconductor wafer, wherein the second optical energy is controlled to match a second intensity profile that produces a uniform heating between a layer of metallic conducting material and an anti-reflective coating layer; and
during application of the second optical energy, firing a metallic conducting material through the anti-reflective coating layer to form a mechanical and electrical bond between the metallic conducting material and the semiconductor layer.

12. The method of claim 11, wherein the semiconductor layer comprises a Si layer, and the metallic back-contact material layer comprises an Al ink material.

13. The method of claim 11, wherein the semiconductor layer comprises an N-type region and a P-type region.

14. The method of claim 11, further comprising performing a dopant diffusion onto a front surface of the semiconductor layer.

15. The method of claim 14, wherein the dopant diffusion comprises an N-Type diffusion.

16. The method of claim 11 further comprising:
applying the anti-reflective material layer to a front surface region of the semiconductor layer.

17. The method of claim 11, wherein the anti-reflective material layer comprises an SiN anti-reflective coating layer.

18. The method of claim 11, wherein the metallic conducting material comprises a Silver (Ag) ink material.

19. The method of claim 11, wherein firing the metallic conducting material through the anti-reflective coating layer forms a mechanical and electrical bond between the metallic conducting material and a doped region of the semiconductor layer.

20. The method of claim 11, wherein temperatures produced within the semiconductor wafer by the second optical energy are less than temperatures produced within the semiconductor wafer by the first optical energy.

21. The method of claim 11, wherein injecting vacancies further comprises diffusing atoms of the semiconductor material into a Si—Al melt.

\* \* \* \* \*